United States Patent
Ferry et al.

(10) Patent No.: US 6,797,062 B2
(45) Date of Patent: Sep. 28, 2004

(54) HEAT SHIELD ASSEMBLY FOR A CRYSTAL PULLER

(75) Inventors: Lee W. Ferry, St. Charles, MO (US); Richard G. Schrenker, Chesterfield, MO (US); Hariprasad Sreedharamurthy, Ballwin, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 81 days.

(21) Appl. No.: 10/252,027

(22) Filed: Sep. 20, 2002

(65) Prior Publication Data

US 2004/0055531 A1 Mar. 25, 2004

(51) Int. Cl.⁷ .............................................. C30B 35/00
(52) U.S. Cl. ................... 117/217; 117/218; 117/222; 117/900
(58) Field of Search ................ 117/208, 217, 117/218, 222, 900

(56) References Cited

U.S. PATENT DOCUMENTS

| | | |
|---|---|---|
| 5,316,742 A | 5/1994 | Tomioka et al. |
| 5,824,152 A | 10/1998 | Kubota et al. |
| 5,951,753 A | 9/1999 | Dornberger et al. |
| 6,197,111 B1 | 3/2001 | Ferry et al. |

FOREIGN PATENT DOCUMENTS

| | | |
|---|---|---|
| EP | 0 591 525 A1 | 4/1994 |
| EP | 0 867 531 A1 | 9/1998 |
| JP | 03153595 | 7/1991 |
| JP | 04059689 | 2/1992 |

*Primary Examiner*—Felisa Hiteshew
(74) *Attorney, Agent, or Firm*—Senniger Powers (57) ABSTRACT

A heat shield assembly is disclosed for use in a crystal puller for growing a monocrystalline ingot from molten semiconductor source material. The heat shield assembly has a central opening sized and shaped for surrounding the ingot as the ingot is pulled from the molten source material. In one aspect, the heat shield assembly includes a multi-sectioned outer shield and a multi-sectioned inner shield. The sections of at least one of the inner and outer shields may be releasably connected to one another so that, in the event a section is damaged, the sections may be separated to allow replacement with an undamaged section. In another aspect the heat shield assembly includes an upper section and a lower section extending generally downward from the upper section toward the molten material. The lower section has a height equal to at least about 33% of a height of the heat shield assembly.

28 Claims, 5 Drawing Sheets

HEAT SHIELD ASSEMBLY FOR A CRYSTAL PULLER

BACKGROUND OF THE INVENTION

The present invention relates to a crystal puller for growing single crystal semiconductor material, and more particularly to a heat shield assembly adapted to be incorporated in a crystal puller.

Single crystal semiconductor material, which is the starting material for fabricating many electronic components, is commonly prepared using the Czochralski ("Cz") method. In this method, polycrystalline semiconductor source material such as polycrystalline silicon ("polysilicon") is melted in a crucible. Then a seed crystal is lowered into the molten material (often referred to as the melt) and slowly raised to grow a single crystal ingot. As the ingot is grown, an upper end cone is formed by decreasing the pull rate and/or the melt temperature, thereby enlarging the ingot diameter, until a target diameter is reached. Once the target diameter is reached, the cylindrical main body of the ingot is formed by controlling the pull rate and the melt temperature to compensate for the decreasing melt level. Near the end of the growth process but before the crucible becomes empty, the ingot diameter is reduced to form a lower end cone which is separated from the melt to produce a finished ingot of semiconductor material.

To increase throughput of the crystal puller, it is desirable to increase the pull rate "v" at which the crystal is pulled up from the melt. However, simply increasing the pull rate, by itself, can be detrimental to the growth and quality of the crystal. For example, an increase in pull rate can result in distortion of the ingot diameter if the ingot is not given sufficient time to cool and solidify as it is pulled up from the melt.

Also, some wafer quality characteristics, such as Gate Oxide Integrity (GOI), are effected by a change in pull rate. Silicon wafers sliced from the ingot and manufactured according to conventional processes often include a silicon oxide layer formed on the surface of the wafer. Electronic circuit devices such as metal oxide semiconductor (MOS) devices are fabricated on this silicon oxide layer. Defects in the surface of the wafer, caused by the agglomerations present in the growing crystal, lead to poor growth of the oxide layer. The quality of the oxide layer, often referred to as the oxide film dielectric breakdown strength, may be quantitatively measured by fabricating MOS devices on the oxide layer and testing the devices. The GOI of the crystal is the percentage of operational devices on the oxide layer of the wafers processed from the crystal.

One way to improve GOI is to control the number of vacancies grown into the ingot upon solidification of the ingot as it is pulled up from the melt. It is understood that the type and initial concentration of vacancies and self-interstitials, which become fixed in the ingot as the ingot solidifies, are controlled by the ratio of the growth velocity (i.e., the pull rate v) to the local axial temperature gradient in the ingot at the time of solidification ($G_o$). When the value of this ratio ($v/G_o$) exceeds a critical value, the concentration of vacancies increases. Thus, to inhibit an increase in the concentration of vacancies, i.e., to avoid increasing the ratio $v/G_o$, the axial temperature gradient at the solid-liquid interface must be correspondingly increased if the pull rate v is increased.

It is well known to increase axial temperature gradient at the solid-liquid interface by positioning a radiation screen or heat shield assembly above the melt surface between the crucible side wall and the growing ingot for shielding the ingot from the heat of the crucible side wall. For example, co-assigned U.S. Pat. No. 6,197,111, which is incorporated herein by reference, discloses a heat shield assembly 50 including insulation 52 contained between coaxially positioned inner and outer reflectors 44, 46. Heat from the crucible 20 is transferred to the outer reflector and to the insulation. Heat transfer from the outer reflector to the inner reflector is inhibited by the insulation and by the minimal direct contact between the inner reflector and the outer reflector. Thus, as the ingot is pulled from the melt, heat is transferred from the ingot to the inner reflector more rapidly. Accordingly, the heat shield assembly increases the axial temperature gradient of the ingot as it is pulled up from the melt, which allows the pull rate of the crystal puller to be increased without distorting the growing ingot.

The performance of the shield assembly of the '111 patent is generally satisfactory. However, the assembly is very expensive to manufacture and maintain, especially when it is sized for large diameter crystal pullers, because each reflector is made of a large, isomolded graphite billet. Generally, larger billets of such material are very expensive, which drives up the cost of the reflector. Moreover, maintenance of the reflectors is expensive because they must be occasionally replaced due to damage. The reflectors must be near the melt for optimum functionality, but the proximity to the melt exposes the reflectors to damage. The reflectors are typically damaged by silicon splatter from the melt or by inadvertent dipping into the melt. Additionally, the reflectors are subject to substantial thermal gradients, due at least in part to the insulation between the reflectors, especially along the bottom of the shield assembly. The gradients typically cause stress and consequent radial cracks in the outer reflector, and such cracks occur more often in larger reflectors. If the damaged reflector is not immediately replaced, particles from the reflector or the insulation therein may be introduced to the melt and thereby cause defects (e.g., LZDs) in the ingot.

Also of interest is U.S. Pat. No. 5,824,152, which shows a radiation screen 1 designed to increase the time the "bottom portion" of the ingot, i.e., the portion at the solid-liquid interface, spends in a temperature region between 1000° and 1200° C. Such a screen design is different from conventional screens, which screen the bottom portion of the ingot from radiant heat so that the ingot passes through the temperature region quickly. (Col. 3, line 66). As shown in FIG. 1 of the patent, the radiation screen 1 is divided into an upper screen 2 and a lower screen 3. Upper screen 2 is of three-layer construction comprising outer graphite members 2b and 2c enclosing heat-insulating member 2a. The lower screen 3 includes a flange for engaging a ledge portion at the bottom end of upper screen 2. The lower screen 3 appears to extend less than about 30% of the total height of the screen 1, and it is of single-layer construction so that the lower screen provides little insulation at the solid-liquid interface. Accordingly, the radiation screen is not designed to substantially increase the axial temperature gradient at the solid-liquid interface.

SUMMARY OF THE INVENTION

Among the several objects and features of the present invention may be noted the provision of a heat shield assembly for a crystal puller that is relatively inexpensive to manufacture and maintain; the provision of such a heat shield assembly that permits modular replacement of damaged parts; the provision of such a heat shield assembly that is suitable for large diameter ingots; the provision of such a heat shield assembly that is damage resistant; and the provision of such a heat shield assembly capable of substantially increasing the axial temperature gradient of the solid-liquid interface to allow the pull rate of the crystal puller to be increased.

Briefly, a heat shield assembly of the present invention is used in a crystal puller for growing a monocrystalline ingot from molten semiconductor source material. The crystal puller has a housing, a crucible contained in the housing for holding molten semiconductor source material and a heater in thermal communication with the crucible for heating the crucible to a temperature sufficient to melt the semiconductor source material held by the crucible. A pulling mechanism is positioned above the crucible for pulling the ingot from the molten source material held by the crucible and a support structure is positioned above the molten source material for supporting the heat shield assembly above the molten source material. The heat shield assembly has a central opening sized and shaped for surrounding the ingot as the ingot is pulled from the molten source material. The heat shield assembly comprises an outer shield adapted for positioning between the ingot and the crucible as the ingot is pulled from the molten source material. The outer shield includes a first section and a second section, the second section extending generally downward from the first section toward the molten material. The assembly further comprises an inner shield adapted for positioning generally between the ingot and the outer shield. The inner shield also includes a first section and a second section, the second section extending generally downward from the first section toward the molten material. The second section of at least one of the inner and outer shields is releasably connected to the respective first section of the same shield so that, in the event one of said releasably connected first and second sections is damaged, the damaged section may be separated from the other section of the shield to allow replacement with an undamaged section without replacement of the other section of the shield.

In another aspect of the invention, the heat shield assembly comprises an upper section interposed between the ingot and the crucible as the ingot is pulled from the molten source material and a lower section extending generally downward from the upper section toward the molten material. The lower section has a height equal to at least about 33% of a height of the heat shield assembly. The lower section has a top end releasably connected to a bottom end of the upper section so that, in the event one of said upper and lower sections is damaged, the damaged section may be separated from the other section of the shield to allow replacement with an undamaged section without replacement of the other section of the shield.

In yet another aspect of the invention, the heat shield assembly comprises an outer shield and an inner shield. A bottom of the shield assembly is defined at least in part by a bottom end of one of the inner and outer shields. A ring is disposed between the outer and inner shields for reducing the thermal gradient across the bottom end to inhibit cracking in said one of the outer and inner shields.

In still another aspect of the invention, the heat shield assembly comprises an outer shield, an inner shield, an annular chamber defined between the inner shield and outer shield, and insulation having a lower end disposed in the chamber. A bottom end of at least one of the outer and inner shields engaging the lower end of the insulation so that the bottom end is subject to a thermal gradient due to the insulation. The bottom end extending only partway across the lower end of the insulation to reduce the thermal gradient in said at least one of the outer and inner shields and thereby inhibit cracking of the shield.

Other objects and features of the present invention will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE PREFERRED EMBODIMENTS

Figure 1:
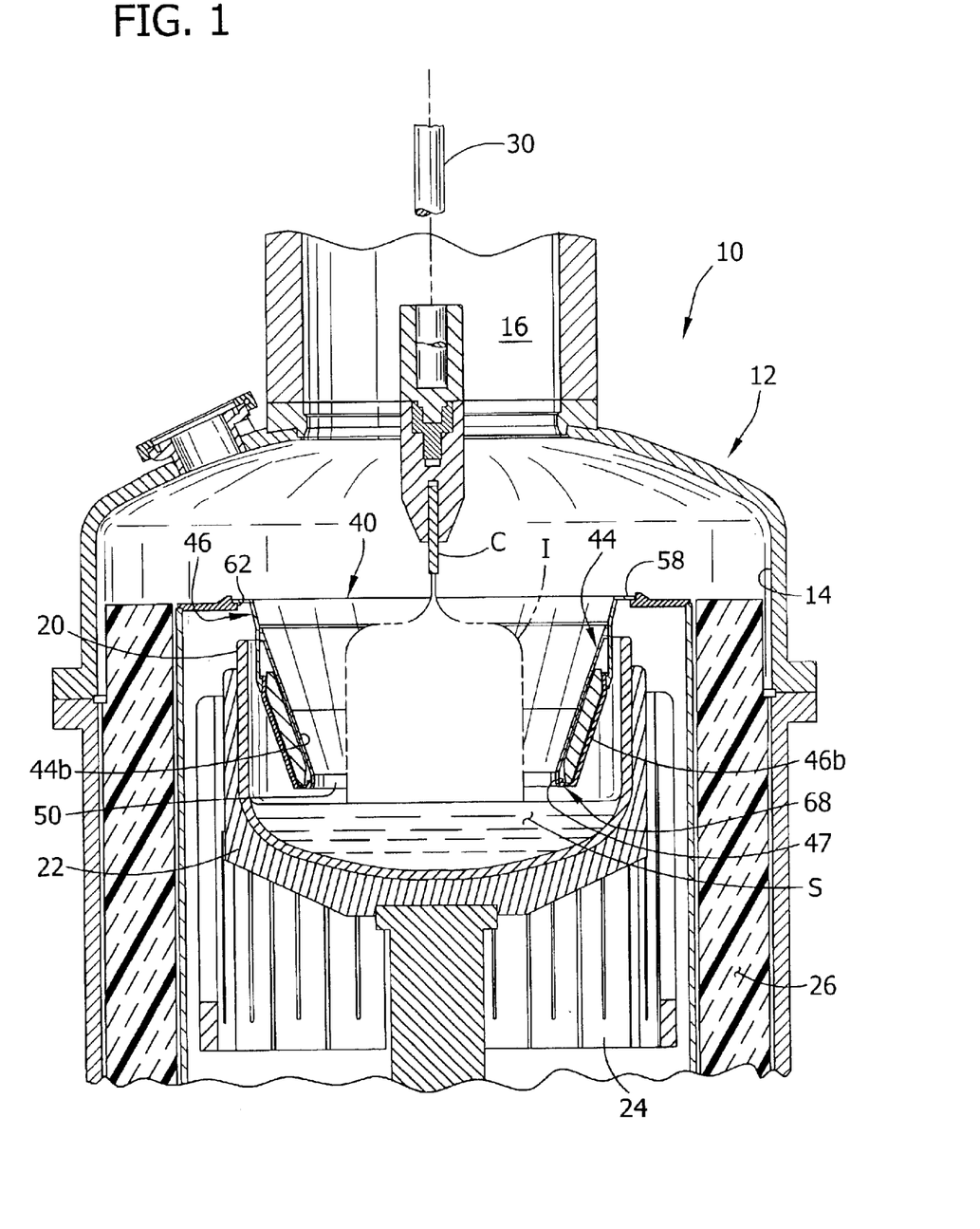
FIG. 1 is a fragmentary vertical section of a crystal puller incorporating a heat shield assembly of the present invention.

Referring now to the drawings and in particular to FIG. 1, an exemplary crystal puller is designated in its entirety by the reference numeral 10. The puller is used to grow monocrystalline ingots I of the type used to manufacture semiconductor wafers. The crystal puller 10 includes a shell (generally indicated at 12) having an interior which includes a crystal growth chamber 14 and a pull chamber 16 disposed above the growth chamber. A quartz crucible 20 is positioned within the growth chamber 14 for holding molten semiconductor source material S from which the monocrystalline silicon ingot I is grown. The crucible 20 is mounted on a motorized turntable 22 which rotates the crucible about a vertical axis and raises the crucible to maintain the surface of the molten source material S at a constant level as the ingot I grows and source material is removed from the crucible.

A resistance heater 24 in thermal communication with the crucible 20 heats the crucible to a temperature sufficient to melt the source material S in the crucible 20. The heater 24 is controlled by an external control system (not shown) so that the temperature of the molten source material is precisely controlled throughout the pulling process. Insulation 26 surrounding the heater 24 reduces the amount of heat lost through the sides of the shell 12 and helps to reduce the heat load on the exterior walls of the puller 10, while allowing process temperatures to be maintained at a lower heater power.

A pulling mechanism (of which only a depending pull shaft 30 is shown in FIG. 1) is positioned above the crucible 20 for rotating a seed crystal C and moving the crystal up and down through the growth chamber 14 and the pull chamber 16. First, the pulling mechanism lowers the seed crystal C through the chambers 14, 16 until it contacts the surface of the molten source material S. Once the seed crystal begins to melt, the pulling mechanism slowly raises the seed C through the chambers 14, 16 to "grow" or pull the monocrystalline ingot I. The speed at which the pulling mechanism rotates the seed C and the speed at which the pulling mechanism raises the seed (i.e., the pull rate v) are controlled by the external control system. The control system also controls the speed at which the crucible 20 moves during the pulling process. The general construction and operation of the crystal puller 10, except to the extent explained more fully below, is conventional and known by those of ordinary skill in the art.

Figure 2:
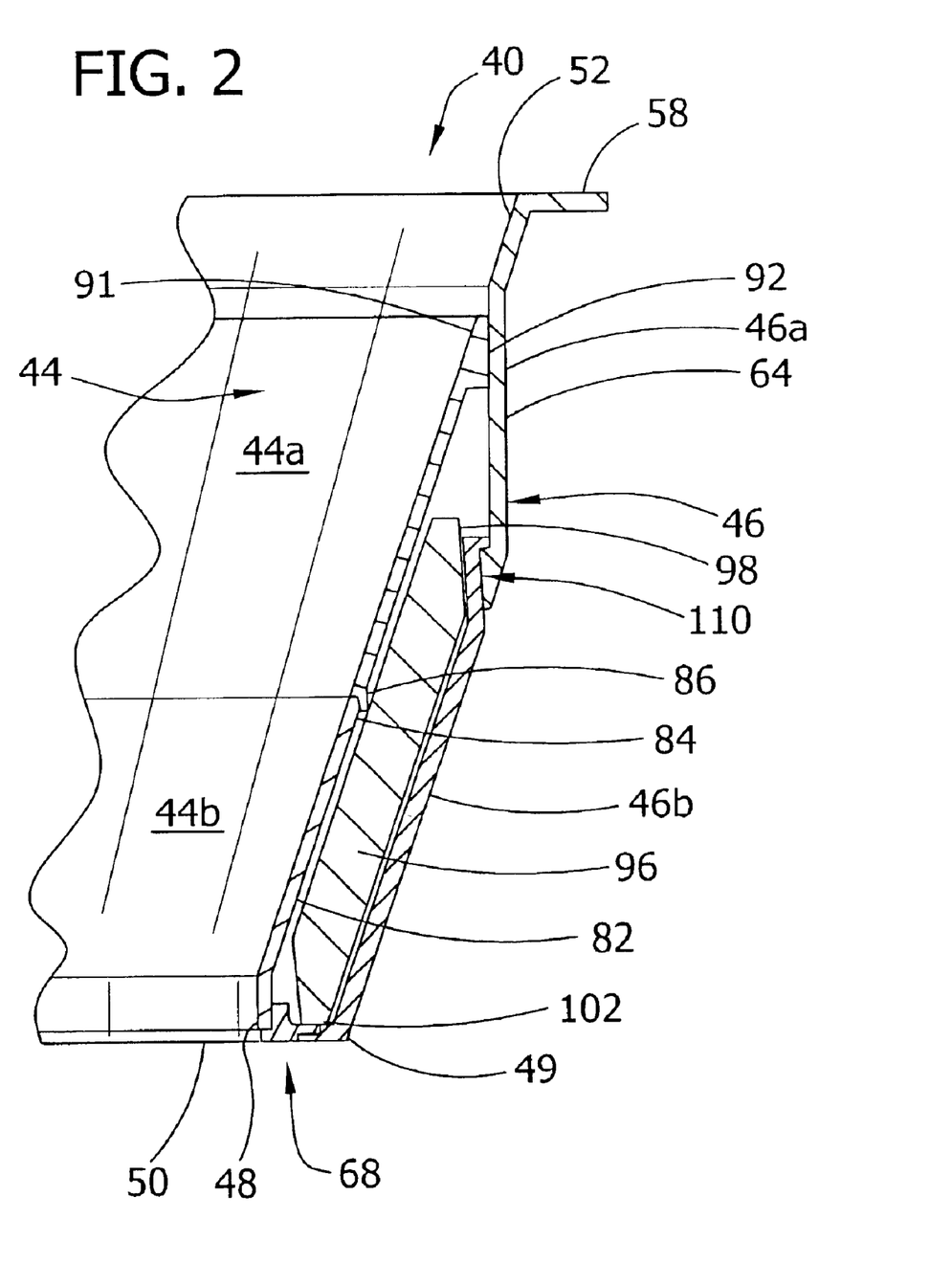
FIG. 2 is an enlarged fragmentary vertical section of the heat shield assembly of FIG. 1.

Referring to FIGS. 1 and 2, a heat shield assembly of the present invention, generally indicated at 40, is mounted in the growth chamber 14 above the molten source material S. The shield assembly 40 is generally frustoconic, though it may have other shapes within the scope of this invention. The heat shield assembly 40 generally comprises co-axially positioned inner and outer shields, generally designated 44 and 46, respectively. Note that the assembly may include only one shield, rather than outer and inner shields, within the scope of this invention. The inner and outer shields 44, 46 are adapted for connection to one another, as further described below. When the shield assembly 40 is installed as shown in FIG. 1, the inner shield 44 is positioned between the ingot I and the outer shield 46. The inner shield 44 has a central opening 47 that defines a central opening of the heat shield assembly 40. The central opening 47 is sized and shaped for surrounding the ingot I as the ingot is pulled upward from the source material S. The central opening 47 of this embodiment is generally circular to accommodate the generally circular cross section of the cylindrical ingot I.

In a preferred embodiment of this invention, the inner shield 44 includes a first or upper section 44a and a second or lower section 44b. Likewise, the outer shield 46 includes a first or upper section 46a and a second or lower section 46b. Each lower section 44b, 46b is releasably connected to the respective upper section 44a, 46a and extends downward from the upper section toward the molten source material S. Bottom ends 48, 49 of respective lower sections 44b, 46b are positioned adjacent one another. In this embodiment, the bottom end 49 of the lower section 46b partially defines a bottom surface 50 of the heat shield assembly 40 that is in spaced relation above the molten source material S. An upper end 52 of the upper section 46b of the outer shield 46 extends radially outward to form an annular upper flange 58 sized and shaped for seating over an annular support structure 62 disposed above the molten source material S (FIG. 1). The heat shield assembly 40 is thereby supported above the molten source material S by the annular support structure 62.

The upper end 52 of the upper section 46a slopes downward and slightly inward from its annular upper flange 58, and a central region 64 of the upper section is generally vertical, extending downward toward a connection (described below) with the lower section 46b. The lower section is generally frustoconic and, as installed in the puller 10, extends generally downward and inward from the upper section 46a such that the outer shield is positioned between the ingot I and the crucible 20 as the ingot is pulled from the molten source material S.

Figure 2A:
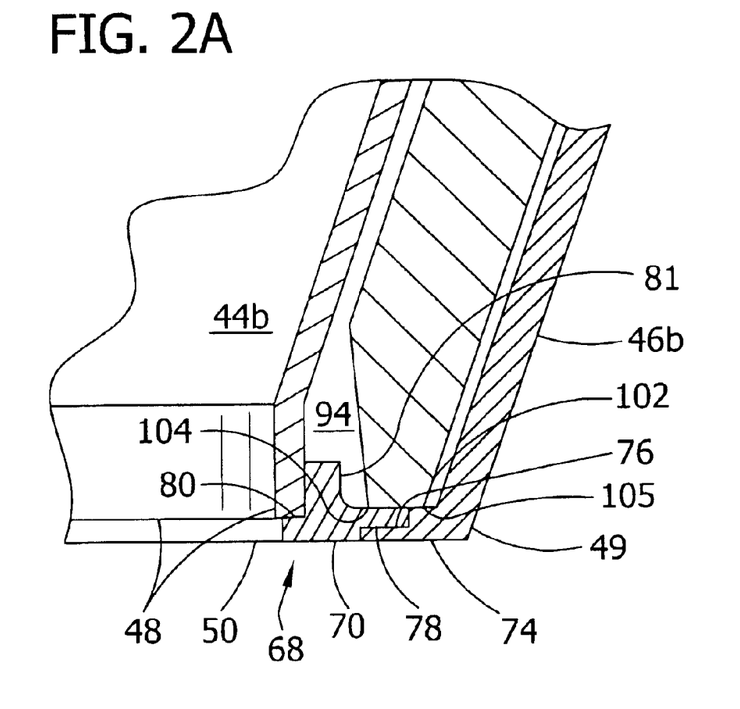
FIG. 2A is a further enlarged fragment of the heat shield assembly of FIG. 2.

A thermal break, generally designated 68, is preferably formed between the respective lower sections 44b, 46b for inhibiting cracking of the sections. As best shown in FIG. 2A, the thermal break 68 of this embodiment comprises an annular spacer ring 70 between the bottom ends 48, 49 of the lower sections 44b, 46b which also forms a portion of the bottom surface 50 of the assembly. A lower annular flange 74 extends radially inward at the bottom end 49 of the lower section 46b of the outer shield 46 toward the adjacent bottom end 48 of the inner shield lower section 44b. In this embodiment, a stepped lap joint is formed between lower section 46b and the ring spacer 70. An annular ledge 76 is formed in the inner peripheral edge of the lower flange 74 for seating the annular spacer ring 70. The spacer ring 70 has a groove 78 at its outer peripheral edge for seating on the annular ledge 76. A similar annular ledge 80 is also formed in the inner peripheral edge of the spacer ring 70 for supporting the bottom end 48 of the inner shield lower section 44b. The bottom end 48 is generally cylindric so that it is adapted for seating on the annular ledge 80 of the spacer ring 70. Other connection means between the spacer ring 70 and the respective lower sections 44b, 46b is contemplated. Note that the spacer ring 70 of this embodiment includes an upwardly extending rib 81 that increases the stiffness or rigidity of the spacer ring.

The spacer ring 70 permits differential expansion and contraction of the lower sections 44b, 46b relative to one another to inhibit cracking of both sections. The spacer ring 70 also inhibits heat conduction from the outer shield lower section 46b to the inner shield lower section 44b. Consequently, the radial thermal gradient and resultant stress across the bottom surface 50 of the shield assembly 40 is reduced, and cracking of the lower sections 44b, 46b of the inner and outer shields 44, 46 is thereby inhibited. However, it is contemplated to omit spacer ring 70 and instead form a suitable joint, such as a lap joint, between the lower sections 44b, 46b. Such a lap joint, though less preferred, still may serve as a thermal break 68 and thereby inhibit cracking of the lower sections 44b, 46b.

Figure 2B:
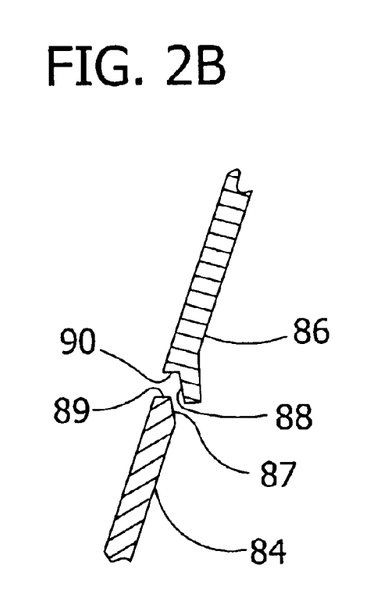
FIG. 2B is an exploded fragmentary section showing a releasable connection between inner shield sections.

Referring to FIGS. 2 and 2B, the inner shield lower section 44b includes a central region 82 that slopes upward and outward from the bottom end 48. A releasable connection is formed between a top end 84 of the lower section 44b and a bottom end 86 of the inner shield upper section 44a. In this embodiment, the top end 84 includes a generally vertical support surface 87 for engaging a flange 88 of the bottom end 86 of the upper section 44a. The top end also includes a generally horizontal support surface 89 for engaging a generally horizontal surface 90 of the upper section bottom end 86. Engagement of the flange 88 and surface 90 with the respective support surfaces 87, 89, substantially ensures that the upper and lower sections 44a, 44b are aligned relative to one another. The upper section 44a extends upward and outward from the bottom end 86 to its connection with the outer shield. As shown in FIG. 2, a top end 91 of the upper section includes an outwardly facing, generally vertical surface 92 adapted to depend from the generally vertical central region 64 of the outer shield upper section 46a.

In this embodiment, an annular chamber 94 is defined between the inner shield 44 and outer shield 46, and insulation 96 is disposed in the chamber between the respective upper sections 44a, 46a and lower sections 44b, 46b for insulating at least a portion of the inner shield 44 against heat transfer from the outer shield 46. The chamber 94 extends generally from the top end 91 of the inner shield upper section 44a to the bottom end 49 of the outer shield lower section 46b. An upper end 98 of the insulation 96 is disposed between the upper sections 44a, 46a. Note that the insulation 96 of this embodiment does not extend all the way to the top of the chamber 94, but may be extended further upward. Also, it is contemplated to omit the insulation, e.g., in order to reduce the thermal gradient across the shield assembly 40. Moreover, cooling coils (not shown), such as those shown and described in co-assigned U.S. application Ser. No. 09/815,509, now U.S. Pat. No. 6,579,362 which is incorporated herein by reference, may be mounted in the chamber. The insulation 96 of this embodiment is preferably constructed of a material having low thermal conductivity, such as a low density graphite.

Referring again to FIG. 2A, the flange 74 at the bottom end 49 of the outer shield lower section 46b engages and supports a lower end 102 of the insulation 96. As will be understood by those of skill in the art, a thermal gradient will occur radially across the insulation 96 because the outer shield 46 is at a higher temperature than the inner shield 44. Accordingly, a lower inner peripheral edge 104 of the insulation will typically have a lower temperature than its lower outer peripheral edge 105. Such a radial thermal gradient is likely to cause stress and consequent cracking in a unitary element (not shown) which engages or supports the lower end 102 of the insulation 96. To inhibit such stress and cracking, the lower end 102 of the insulation is preferably supported by at least two separate elements. In this embodiment, the lower end 102 of the insulation is supported by the flange 74 of the outer shield lower section 46b and by the spacer ring 70. Thus, the flange 74 extends only partway across the lower end 102 of the insulation to reduce the thermal gradient in the flange and thereby inhibit cracking of the lower section. It is contemplated within the scope of this invention that the bottom end 48 of the inner shield lower section 44b be sized and shaped to engage the insulation 96 instead of or in addition to the bottom end of the outer section.

In the preferred embodiment, most of the inner shield 44 is in spaced relationship from the insulation 96 to inhibit heat transfer from the insulation to the inner shield. Also, the inner shield 44 is radially spaced from the outer shield 46 so that the only contact between the inner and outer shields occurs at their respective top and bottom ends. Spacing the inner shield 44 from the outer shield 46 in this manner reduces the amount of heat transferred from the outer shield to the inner shield so that the ingot will cool more quickly.

The releasable connection between the outer shield upper and lower sections 46a, 46b is readily seen in FIGS. 3 and 4A–4C. In this embodiment, the connection is a bayonet-type connection 110 including at least one male member or projection 112 on one of the two sections 46a, 46b which upon rotation of the sections relative to one another is received in or mates with at least one socket 114 of the other section. It will be understood that other types of connections, e.g., a threaded connection, are contemplated within the scope of this invention. A bottom end 116 of the outer shield upper section 46a includes an opening defined by an inwardly extending lip 118. A corresponding, radially outwardly extending lip 120 at a top end of the lower section 46b is sized and shaped to engage the inwardly extending lip 118 of the upper section 46a. The bayonet-type connection includes three projections 112 extending downwardly from the lip of the lower section 46b. Three sockets 114 for receiving the projections 112 are formed near the lip 118 of the upper section, each socket being sized and shaped to receive one of the projections of the lower section. Note that the number of the projections 112 and sockets 114 (generally, connection elements) may vary. As shown most clearly in FIG. 4A, each socket 114 is bordered on its lower side by the lip 118 and on its upper side and its closed side (left side as viewed in FIG. 4A) by hook 122 extending from the lip. A small cut-out or seat 124 is formed in the lip 118 opposite each hook 122 at an inner end of the hook. The lip 120 of the lower section 46b includes three breaks 126, each break being sized to receive one of the hooks 122 of the upper section 46a through the lip 120.

The upper sections 44a, 46a and lower sections 44b, 46b of the inner and outer shields 44, 46, as well as the spacer ring 70, are constructed of a suitable material such as silicon carbide coated graphite. However, it is understood that the upper sections 44a, 46a and lower sections 44b, 46b and the spacer ring 70 may be constructed of other graphite materials, or of quartz, ceramics or any refractory metals within the scope of this invention.

The inner and outer shields 44, 46 are machined from isomolded graphite billets. Compared to the graphite billets used for the large, unitary inner and outer shields shown in U.S. Pat. No. 6,197,111, the billets used to make the inner and outer shields 44, 46 of this invention are much less expensive because each shield is preferably made in at least two smaller sections. Note that it is contemplated that one or the other of the shields may be made as one unitary piece rather than in sections. In this embodiment, each lower section 44b, 46b has a height between about 33% to about 66% of a height of the heat shield assembly. More preferably, and in order to further reduce the cost of the sections 44a, 44b, 46a, 46b of the respective inner and outer shields 44, 46, each section (upper and lower) is about 45% to about 55% of a height of the respective shield. Note that it is contemplated that the inner shield and/or the outer shield include more than two sections. For example, either shield may include three sections wherein each section has a height equal to about 33% of the total height of the shield.

Figure 3:
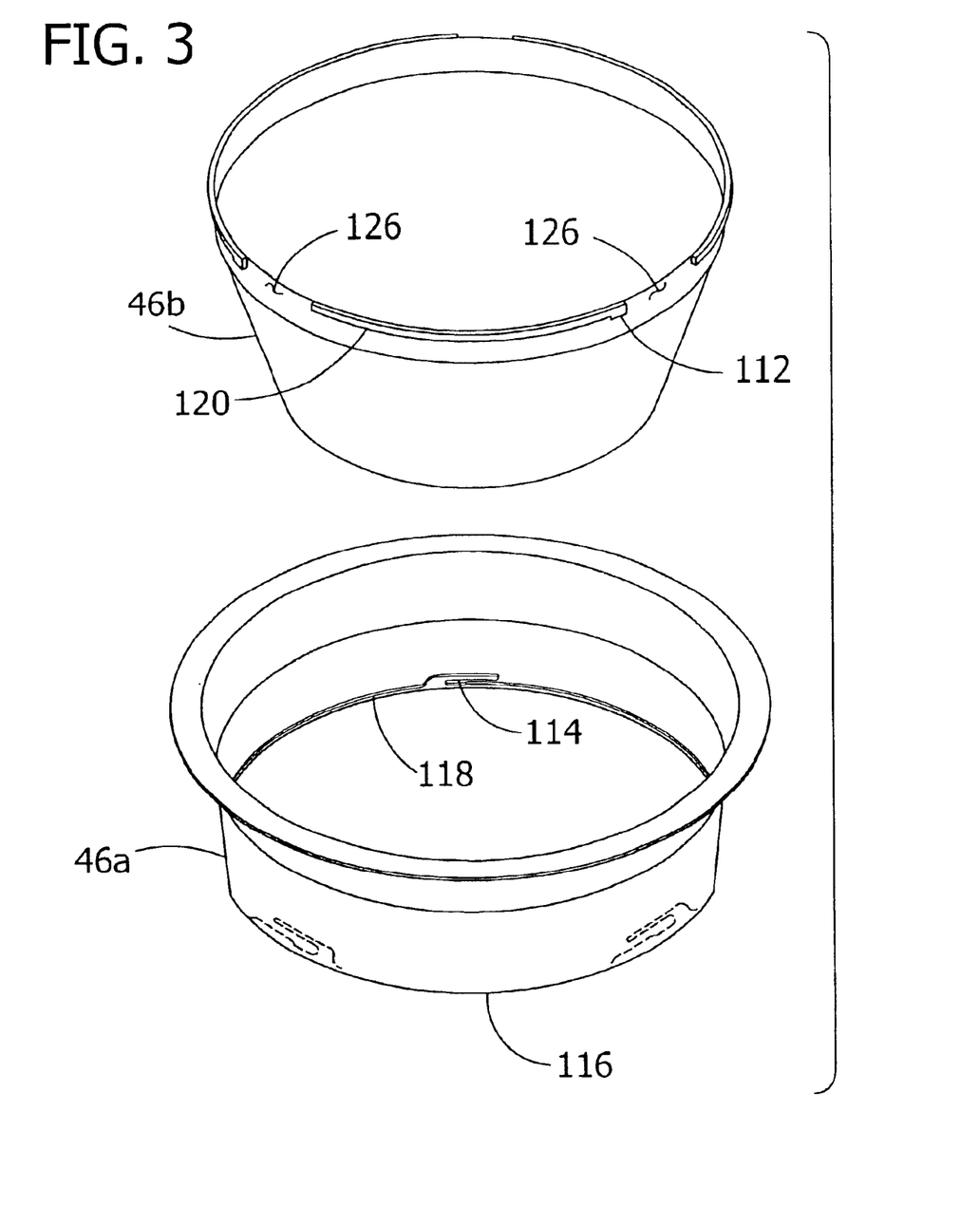
FIG. 3 is an exploded perspective showing unconnected upper and lower sections of an outer shield of the heat shield assembly.
Figure 4A:
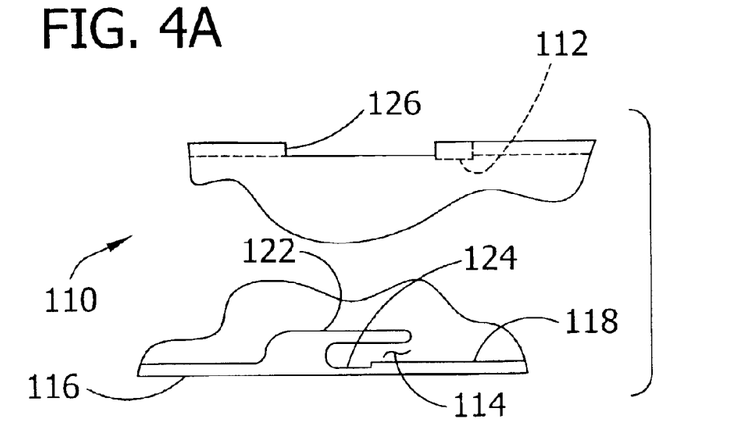
FIGS. 4A–4C are fragmentary portions of the inner and outer heat shield assembly section, progressively illustrating their interconnection.
Figure 4B:
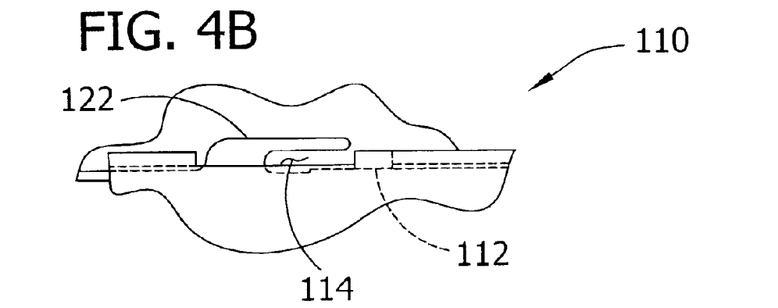
Figure 4C:
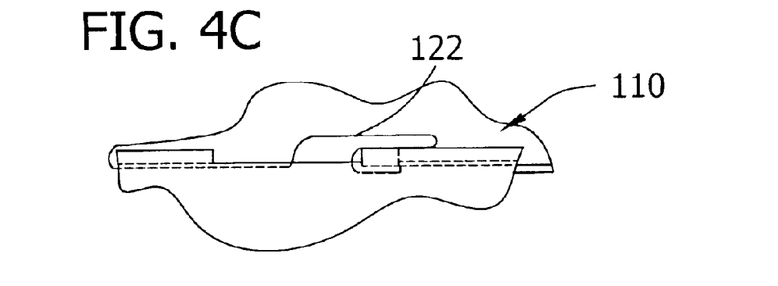
Figure 4D:
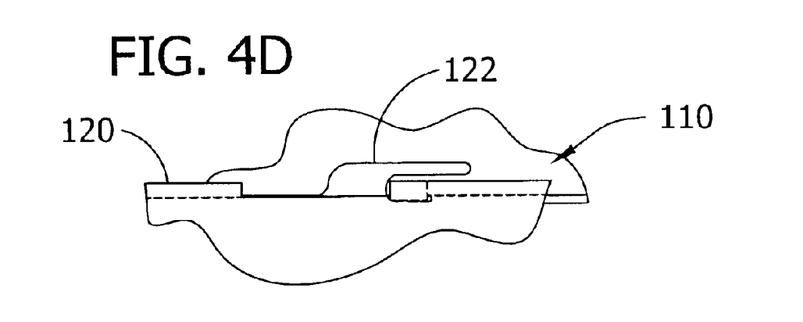
FIG. 4D is a development of FIG. 4C showing the connection after the heat shield assembly is placed in the crystal puller.

To assemble the shield assembly, the outer shield upper section 46a is placed on a flat work surface and the lower section 46b is placed inside the opening of the upper section (see FIG. 3). The sections 46a, 46b are oriented relative to one another so that the hooks 122 are directly beneath respective passages 126 in the lip of the lower section (FIG. 4A). The upper section 46a is then lifted vertically so that the hooks 122 pass through the breaks 126 and the lip 118 engages the projection 112 (FIG. 4B). The upper section 46a is then rotated until the projections engage the closed inner end of the hooks 112 (FIG. 4C). When the connectors are thus engaged, they substantially prevent relative vertical movement between the upper and lower sections 46a, 46b. After the upper and lower sections are connected, the spacer ring 70 is placed in the groove 78 of the lower section 46b, and the insulation 96 is placed on the flange 74 of the lower section and on the spacer ring. The inner shield lower section 44b is then positioned against the annular ledge 80 of the spacer ring 70. The assembly is completed by placing the upper section 44a so that its bottom end engages the support surfaces 87, 89 of the lower section 44b and its top end 91 engages the outer shield upper section 46a. The complete shield assembly 40 is then placed in the crystal puller 10 (FIG. 1) so that the upper flange 58 engages the support structure 62. Typically, nothing else is needed to secure the shield assembly 40 relative to the puller 10. Note that when the weight of the assembly 40 rests on the support structure inside the puller 10, the projections 112 of the lower section 46b seat in their respective seats 124 (FIG. 4D) so that rotation of the upper and lower sections relative to one another is inhibited.

The construction of the shield assembly 40 allows it to be conveniently removed in one piece from the crystal puller 10 and thereafter disassembled by reversing the above steps. During use of the puller 10, one or more sections 44a,b, 46a,b, or the spacer ring 70 may become damaged. In such case, the damaged section or spacer ring is separated from the assembly 40 and replaced with an undamaged section or spacer ring 70. It is expected that most typically, one of the lower sections 44b, 46b will be damaged by molten source material S. In such event, the damaged lower section is separated from its adjacent upper section and replaced with an undamaged lower section. Because the other sections of the shield assembly are not necessarily replaced, the cost of maintaining the assembly is thereby reduced.

In view of the above, it will be seen that the several objects of the invention are achieved and other advantageous results attained.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description or shown in the accompanying drawings shall be interpreted as illustrative and not in a limiting sense.

What is claimed is:

1. A heat shield assembly for use in a crystal puller for growing a monocrystalline ingot from molten semiconductor source material, the crystal puller having a housing, a crucible contained in the housing for holding molten semiconductor source material, a heater in thermal communication with the crucible for heating the crucible to a temperature sufficient to melt the semiconductor source material held by the crucible, a pulling mechanism positioned above the crucible for pulling the ingot from the molten source material held by the crucible, and a support structure positioned above the molten source material for supporting the heat shield assembly above the molten source material, the heat shield assembly having a central opening sized and shaped for surrounding the ingot as the ingot is pulled from the molten source material, said heat shield assembly comprising:

an outer shield adapted for positioning between the ingot and the crucible as the ingot is pulled from the molten source material, the outer shield including a first section and a second section, the second section of the outer shield extending generally downward from the first section toward the molten material, an inner shield adapted for positioning generally between the ingot and the outer shield, the inner shield including a first section and a second section, the second section of the inner shield extending generally downward from the first section toward the molten material, the second section of at least one of the inner and outer shields being releasably connected to the respective first section of the same shield so that, in the event one of said releasably connected first and second sections is damaged, the damaged section may be separated from the other section of the shield to allow replacement with an undamaged section without replacement of the other section of the shield.

2. A heat shield assembly as set forth in claim 1 wherein the respective second sections of the inner and outer shields are both releasably connected to their respective first sections.

3. A heat shield assembly as set forth in claim 2 wherein the respective second sections are formed for releasable connection and are free of connectors separate from the shield.

4. A heat shield assembly as set forth in claim 1 wherein the second section of at least one of the inner and outer shields has a height of between about 33% to about 66% of a height of the heat shield assembly.

5. A heat shield assembly as set forth in claim 4 wherein each section of the respective inner and outer shields has a height of about 45% to about 55% of a height of the respective shield.

6. A heat shield assembly as set forth in claim 1 further comprising a thermal break between the second sections of the inner and outer shields for inhibiting cracking of the respective sections.

7. A heat shield assembly as set forth in claim 6 wherein the thermal break includes a ring disposed between the outer and inner shields for permitting expansion and contraction of the second sections relative to one another.

8. A heat shield assembly as set forth in claim 7 further comprising an annular chamber defined between the inner shield and outer shield, and insulation disposed in the chamber.

9. A heat shield assembly as set forth in claim 8 wherein a lower end of the insulation engages the bottom end of at least one of the second sections so that said bottom end is subject to a thermal gradient due to the insulation, said bottom end of said at least one second section extending only partway across the lower end of the insulation to reduce the stress in said second section and thereby inhibit cracking of said second section.

10. A heat shield assembly as set forth in claim 8 wherein said chamber and the insulation therein extends between respective first sections and respective second sections of the inner and outer shields.

11. A heat shield assembly as set forth in claim 6 wherein the second section of at least one of the inner and outer shields has a height of between about 33% to about 66% of a height of the heat shield assembly.

12. A heat shield assembly as set forth in claim 11 wherein a top end of the first section of the outer shield includes a flange sized and shaped to releasably engage the support structure of the crystal puller.

13. A heat shield assembly as set forth in claim 11 wherein the first section of the inner shield has a top end releasably engaging the first section of the outer shield.

14. A heat shield assembly as set forth in claim 1 wherein a bottom end of the first section of the outer shield includes a connector releasably connected to a mating connector at a top end of the second section of the outer shield.

15. A heat shield assembly as set forth in claim 14 wherein the connectors form a bayonet connection for substantially preventing relative vertical movement between the upper and lower sections.

16. A heat shield assembly as set forth in claim 1 in combination with the crystal puller.

17. A heat shield assembly as set forth in claim 1 wherein the inner and outer shields are made of silicon carbide coated graphite.

18. A heat shield assembly for use in a crystal puller for growing a monocrystalline ingot from molten semiconductor source material, the crystal puller having a housing, a crucible contained in the housing for holding molten semiconductor source material, a heater in thermal communication with the crucible for heating the crucible to a temperature sufficient to melt the semiconductor source material held by the crucible, a pulling mechanism positioned above the crucible for pulling the ingot from the molten source material held by the crucible, and a support structure positioned above the molten source material for supporting the heat shield assembly above the molten source material, the heat shield assembly having a central opening sized and shaped for surrounding the ingot as the ingot is pulled from the molten source material, said heat shield assembly comprising:

an upper section adapted for positioning between the ingot and the crucible as the ingot is pulled from the molten source material; and a lower section extending generally downward from the upper section toward the molten material, the lower section having a height equal to at least about 33% of a height of the heat shield assembly, the lower section having a top end releasably connected to a bottom end of the upper section so that, in the event one of said upper and lower sections is damaged, the damaged section may be separated from the other section of the shield to allow replacement with an undamaged section without replacement of the other section of the shield.

19. A heat shield assembly as set forth in claim 18 wherein the height of the lower section is no more than about 66% of a height of the heat shield assembly.

20. A heat shield assembly as set forth in claim 19 wherein the height of the lower section and a height of the upper section is between about 45% to about 55% of a sum of the heights of the upper and lower sections.

21. A heat shield assembly for use in a crystal puller for growing a monocrystalline ingot from molten semiconductor source material, the crystal puller having a housing, a crucible contained in the housing for holding molten semiconductor source material, a heater in thermal communication with the crucible for heating the crucible to a temperature sufficient to melt the semiconductor source material held by the crucible, a pulling mechanism positioned above the crucible for pulling the ingot from the molten source material held by the crucible, and a support structure positioned above the molten source material for supporting the heat shield assembly above the molten source material, the heat shield assembly having a central opening sized and shaped for surrounding the ingot as the ingot is pulled from the molten source material, said heat shield assembly comprising:

an outer shield adapted for positioning between the ingot and the crucible as the ingot is pulled from the molten source material; and an inner shield adapted for positioning between the ingot and the outer shield;

a bottom of the shield assembly defined at least in part by a bottom end of one of the inner and outer shields and a ring disposed between the outer and inner shields for inhibiting cracking in said at least one of the outer and inner shields.

22. A heat shield assembly as set forth in claim 21 further comprising an annular chamber defined between the inner shield and outer shield, and insulation disposed in the chamber.

23. A heat shield assembly as set forth in claim 21 wherein a lap joint is formed between the bottom end of the outer shield and the ring.

24. A heat shield assembly as set forth in claim 21 wherein the ring includes a ledge for supporting the bottom end of the inner shield.

25. A heat shield assembly as set forth in claim 21 wherein the inner and outer shields and the ring are releasably connected for allowing replacement in the event of damage.

26. A heat shield assembly for use in a crystal puller for growing a monocrystalline ingot from molten semiconductor source material, the crystal puller having a housing, a crucible contained in the housing for holding molten semiconductor source material, a heater in thermal communication with the crucible for heating the crucible to a temperature sufficient to melt the semiconductor source material held by the crucible, a pulling mechanism positioned above the crucible for pulling the ingot from the molten source material held by the crucible, and a support structure positioned above the molten source material for supporting the heat shield assembly above the molten source material, the heat shield assembly having a central opening sized and shaped for surrounding the ingot as the ingot is pulled from the molten source material, said heat shield assembly comprising:

an outer shield adapted for positioning between the ingot and the crucible as the ingot is pulled from the molten source material;

an inner shield adapted for positioning between the ingot and the outer shield;

an annular chamber defined between the inner shield and outer shield; and insulation disposed in the chamber and having a lower end;

a bottom end of at least one of the outer and inner shields engaging the lower end of the insulation so that said bottom end is subject to a thermal gradient due to the insulation, said bottom end extending only partway across the lower end of the insulation to reduce the stress in said at least one of the outer and inner shields and thereby inhibit cracking of the shield.

27. A heat shield assembly as set forth in claim 26 further comprising a ring disposed between the outer and inner shields.

28. A heat shield assembly as set forth in claim 26 wherein the inner and outer shields are releasably connected for allowing replacement in the event or damage.

* * * * *

UNITED STATES PATENT AND TRADEMARK OFFICE
CERTIFICATE OF CORRECTION

PATENT NO. : 6,797,062 B2
DATED : September 28, 2004
INVENTOR(S) : Lee W. Ferry et al.

It is certified that error appears in the above-identified patent and that said Letters Patent is hereby corrected as shown below:

<u>Column 7,</u>
Line 2, "Ser. No. 09/815,509," should be -- Ser. No. 09/815,508, --.

<u>Column 12,</u>
Line 51, "event or damage" should read -- event of damage --.

Signed and Sealed this

Twenty-fifth Day of April, 2006

JON W. DUDAS
*Director of the United States Patent and Trademark Office*